(12) United States Patent
Giusti et al.

(10) Patent No.: US 10,532,922 B2
(45) Date of Patent: Jan. 14, 2020

(54) MICRO-ELECTRO-MECHANICAL ACTUATOR DEVICE OF PIEZOELECTRIC TYPE AND APPARATUS INTEGRATING THE MICRO-ELECTRO-MECHANICAL ACTUATOR DEVICE

(71) Applicant: STMicroelectronics S.r.l., Agrate Brianza (MB) (IT)

(72) Inventors: Domenico Giusti, Monza (IT); Carlo Luigi Prelini, Seveso (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 16/197,810

(22) Filed: Nov. 21, 2018

(65) Prior Publication Data
US 2019/0161338 A1    May 30, 2019

(30) Foreign Application Priority Data

Nov. 27, 2017   (IT) .......................... 102017000135836

(51) Int. Cl.
*H01L 29/82* (2006.01)
*B81B 3/00* (2006.01)
*H04R 17/00* (2006.01)

(52) U.S. Cl.
CPC .......... *B81B 3/0037* (2013.01); *H04R 17/00* (2013.01); *B81B 2201/0257* (2013.01); *B81B 2201/032* (2013.01); *B81B 2203/0127* (2013.01)

(58) Field of Classification Search
CPC ......... H01L 41/0973; B81B 2203/0127; B81B 3/00; B81B 7/0032; B81B 7/008; B81B 3/0037; B81B 7/0048

USPC ......................................................... 257/416
See application file for complete search history.

(56) References Cited

U.S. PATENT DOCUMENTS

2008/0074006 A1   3/2008  Kawakubo et al.
2008/0278035 A1*  11/2008 Higashionji ........ H01L 41/0913
                                              310/330
2009/0230818 A1*  9/2009  Mukae ................ H01L 41/0913
                                              310/323.16

(Continued)

FOREIGN PATENT DOCUMENTS

JP       S59177979 A      10/1984

OTHER PUBLICATIONS

IT Search Report and Written Opinion for IT Appl. No. 102017000135836 dated Aug. 9, 2018 (9 pages).

(Continued)

*Primary Examiner* — Theresa T Doan
(74) *Attorney, Agent, or Firm* — Crowe & Dunlevy (57) ABSTRACT

A micro-electro-mechanical actuator device includes a fixed structure and a mobile structure. The mobile structure includes a first deformable band, a second deformable band, and a third deformable band, both of which extend on opposite sides of the first deformable band, each of which carries a piezoelectric actuator. In a working condition, in which the second and third piezoelectrics are biased, the second and third deformable bands are subjected to a negative bending, while the first deformable band is subjected to a positive bending. There are thus generated two translations that add together, causing a displacement of the first deformable band greater than the one that may be obtained by a single membrane of an equal base area.

26 Claims, 7 Drawing Sheets

(56) References Cited

U.S. PATENT DOCUMENTS

2012/0250130 A1   10/2012  Naono
2013/0334928 A1   12/2013  Clark

OTHER PUBLICATIONS

James D. Ervin et al: "Recurve piezoelectric-strain-amplifying actuator architecture" IEEE / ASME Transactions on Mechatronics, IEEE Service Center, Piscataway, NJ, US, pp. 293-300, plus cover sheet.

* cited by examiner

MICRO-ELECTRO-MECHANICAL ACTUATOR DEVICE OF PIEZOELECTRIC TYPE AND APPARATUS INTEGRATING THE MICRO-ELECTRO-MECHANICAL ACTUATOR DEVICE

PRIORITY CLAIM

This application claims the priority benefit of Italian Application for Patent No. 102017000135836, filed on Nov. 27, 2017, the content of which is hereby incorporated by reference in its entirety to the maximum extent allowable by law.

TECHNICAL FIELD

The technology described herein relates to an actuator device based upon piezoelectric technology and to an apparatus, in particular a speaker, which includes the actuator device. In particular, reference will be made hereinafter to an actuator realized via MEMS (Micro-Electro-Mechanical System) technology.

BACKGROUND

Micromechanical actuators are known as having a membrane structure, which is produced with the technology of semiconductor materials. The membrane, provided with one or more piezoelectric elements, is made to deflect in a driving direction by appropriate control of the piezoelectric elements. The mechanical deformation of the membrane has a specific utility according to the application in which it is used. For instance, in fluidic applications, the membrane may form part of a micropump or a printhead, and its deflection may be used to cause displacement of a mass of fluid.

Other applications of micromechanical actuators include, for example, acoustic applications. Piezoeletrically actuated membranes are, for example, used in miniaturized speakers that are integrated in portable apparatuses, such as portable computers, laptops, notebooks (including the ultra-thin notebooks), PDAs, tablets, and smartphones.

Thanks to the small dimensions, said devices make it possible to respect stringent requirements regarding the occupation of space, in terms of both area and thickness.

It has been found that, frequently, the deflection required of membranes of actuators of a known type is of several hundreds of micrometers (500-2000 µm) in a direction orthogonal to the plane of the membrane itself (out-of-plane deflection). This performance may be obtained by increasing the area of the membrane, at the expense of occupation of space.

There is a need in the art to provide a micro-electro-mechanical device with piezoelectric actuation that will overcome the drawbacks of the prior art.

SUMMARY

In an embodiment, a micro-electro-mechanical actuator device includes a fixed structure and a mobile structure. The mobile structure is configured to move along a driving direction and includes a first deformable band, a second deformable band and a third deformable band which lie, in a first operating condition, in a resting plane and have a respective main extension along a first direction orthogonal to the driving direction. The first deformable band is arranged between the second and third deformable bands and is mechanically uncoupled, along the first direction, from the second and third deformable bands by respective first and second through trenches.

The first, second, and third deformable bands each have respective ends and being joined together at their ends.

The second deformable band is further connected to the fixed structure by a first supporting element, and the third deformable band is fixed to the fixed structure by a second supporting element, the first and second supporting elements being aligned to one another, at least in the first operating condition, along a same first axis of symmetry orthogonal to the first direction.

The first, second, and third deformable bands house first, second, and third piezoelectrics, respectively.

The second and third deformable bands and the respective second and third piezoelectrics are arranged with respect to one another and configured so that, in a second operating condition where the second and third piezoelectrics are biased, the second and third deformable bands are subjected to a negative bending that causes a translation of said ends and of the first deformable band in said driving direction.

The first deformable band and the respective first piezoelectric are arranged with respect to one another and configured so that, when the first piezoelectric is biased at the working voltage, the first deformable band is subjected to a positive bending that causes a further translation in the driving direction of at least one portion of the first deformable band, which extends between said ends of the first deformable band.

BRIEF DESCRIPTION OF THE DRAWINGS

For a better understanding, an embodiment is now described, purely by way of non-limiting example, with reference to the attached drawings, wherein.

DETAILED DESCRIPTION

Figure 1:
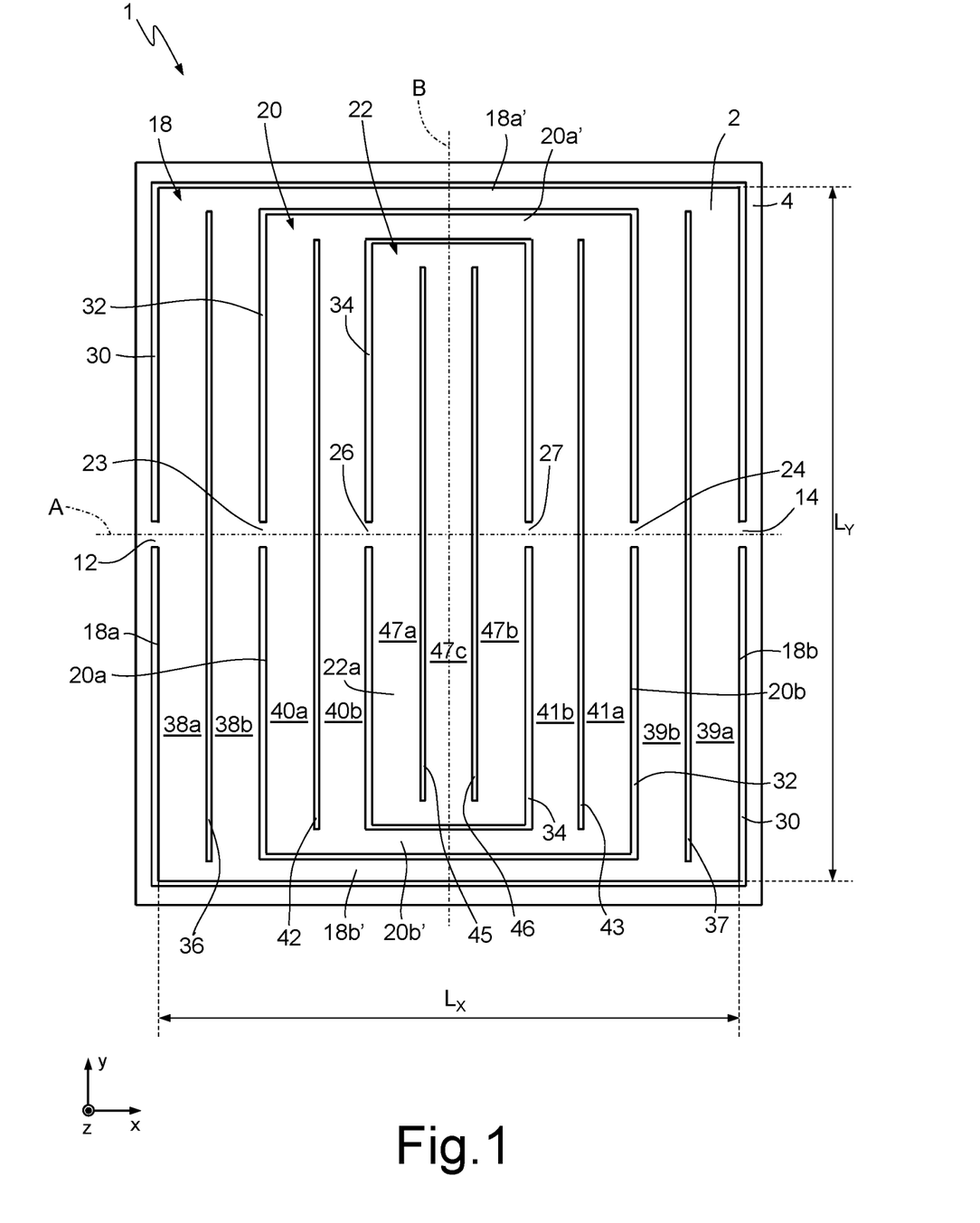
FIG. 1 illustrates, in top plan view, a MEMS actuator according to an aspect of this disclosure.

FIG. 1 illustrates a portion of an actuator 1, of a micro-electro-mechanical type, in a triaxial reference system, with mutually orthogonal axes X, Y, Z. In particular, FIG. 1 illustrates the actuator 1 in top view in the plane XY, according to an embodiment.

The actuator 1 is provided with a deformable structure 2 designed to bend in the direction of the axis Z and orthogonal to the plane XY. The deformable structure 2 is supported by a frame 4 of a fixed type, which surrounds the deformable structure 2 completely. In a different embodiment, not illustrated, the frame 4 may surround the deformable structure 2 only partially.

Figure 3:
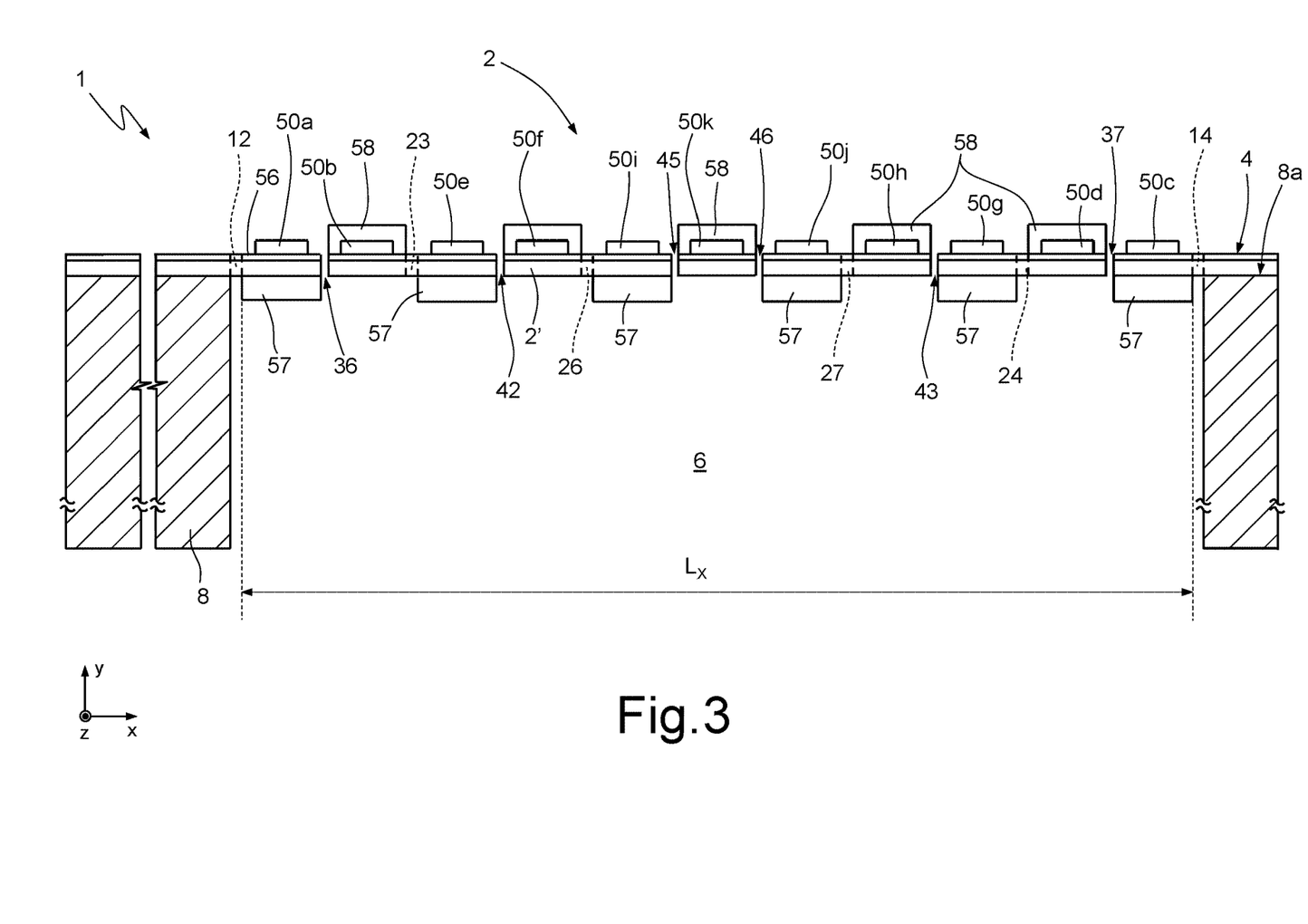
FIG. 3 illustrates, in lateral cross-sectional view, the MEMS actuator of FIG. 2.

As may be seen in FIG. 3, described more fully in what follows, the deformable structure 2 is suspended over a cavity 6 obtained, for example, by etching into a substrate 8 using micromachining techniques. The deformable structure 2 extends, in this embodiment, on a front side 8a of the substrate 8.

It is irrelevant whether the substrate 8 is a monolithic block or else is formed by a plurality of regions or layers arranged on top of one another (e.g., layers grown epitaxially). The substrate 8 may include one or more semiconductor and/or insulating materials. The frame 4 may be integrated in the substrate 8, or else be formed by the substrate 8 itself.

The frame 4 is mechanically coupled to the deformable structure 2 by a first supporting element, or restraint, 12 and a second supporting element, or restraint, 14, which have a shape and size substantially the same as one another and are aligned with one another in a direction parallel to the axis X. In one embodiment, the first supporting element 12 and the second supporting element 14 both lie in a resting condition and in an operating condition (the latter being illustrated more fully in what follows), in the same plane parallel to the plane XY.

The first and second supporting elements 12, 14 are, for example, formed as a local prolongation of the frame 4.

By way of example, the frame 4 has a quadrangular shape, with extension along the axis X of approximately 2 mm and extension along the axis Y of approximately 2 mm. The first and second supporting elements 12, 14 have, by way of example, a quadrangular shape, with extension along the axis X of approximately 20 µm and extension along the axis Y of approximately 85 µm.

The thickness, along the axis Z, of the first and second supporting elements 12, 14 is approximately 4 µm.

In one embodiment, the frame 4 includes, for example, a layer of (monocrystalline or polycrystalline) silicon, deposited or grown on the front side 8a of the substrate 8; it is evident that other materials may be used, in addition to or instead of silicon.

The above layer of (monocrystalline or polycrystalline) silicon, deposited or grown on the front side 8a of the substrate 8, likewise forms, according to an embodiment, a base supporting layer 2' that defines the shape of the deformable structure 2 (see, for example, FIG. 3).

The thickness, measured along the axis Z, of the base supporting layer 2' is, for example, between 0.5 µm and 20 µm.

In one embodiment, the frame 4, the first and second supporting elements 12, 14, and the deformable structure 2 are made of a single piece and, in the resting condition, lie in the same plane (here, the plane XY).

The deformable structure 2 and the supporting frame 4 may be obtained starting from a wafer of semiconductor material, for example silicon, using semiconductor-machining techniques, such as etching, growth, deposition, and/or selective removal.

The deformable structure 2 here has a quadrangular shape, in particular rectangular with a major side $L_Y$ along the axis Y and a minor side $L_X$ along the axis X. For instance, the major side $L_Y$ is 2.5 mm, and the minor side $L_X$ is 2 mm.

The deformable structure 2 is further symmetrical both with respect to an axis of symmetry A, parallel to the axis X and passing through a geometrical center O of a rectangle of sides $L_Y$ and $L_X$ that defines the outer edges of the deformable structure 2, and with respect to an axis of symmetry B, parallel to the axis Y and passing through the geometrical center O. The first and second supporting elements 12, 14 are aligned with respect to one another along the axis of symmetry A and symmetrical with respect to the axis of symmetry A; they are further symmetrical to one another with respect to the axis of symmetry B.

The deformable structure 2 comprises a first functional sub-structure 18, a second functional sub-structure 20, and a third functional sub-structure 22. The first, second, and third functional sub-structures 18, 20, and 22 also have a quadrangular shape, in particular a rectangular shape. The first, second, and third functional sub-structures 18, 20, and 22 have respective outer edges that define respective mutually concentric rectangles, i.e., ones having the same geometrical center, corresponding to the geometrical center O of the rectangle of sides $L_Y$ and $L_X$ mentioned above.

The first, second, and third functional sub-structures 18, 20, and 22 are mechanically coupled together by coupling or restraint elements 23, 24 and 26, 27. The coupling elements 23 and 24 couple the first functional sub-structure 18 to the second functional sub-structure 20, extend symmetrically with respect to the axis of symmetry B, and are aligned along the first axis of symmetry A (along the axis X). The coupling elements 23 and 24 are likewise aligned, along the axis A, to the first and second supporting elements 12 and 14. The coupling elements 26 and 27 constrain the second functional sub-structure 20 to the third functional sub-structure 22 and extend symmetrically to one another with respect to the axis of symmetry B, and are aligned, along the first axis of symmetry A, to the first and second supporting elements 12, 14 and to the coupling elements 23 and 24.

In other words, the frame 4 and the first, second, and third functional sub-structures 18, 20, and 22 are mutually coplanar and lie, in the resting condition, in the plane XY, and extend so that: the frame 4 surrounds completely, in the plane XY, the first functional sub-structure 18; the first functional sub-structure 18 surrounds completely, in the plane XY, the second functional sub-structure 20; and the second functional sub-structure 20 surrounds completely, in the plane XY, the third functional sub-structure 22. The first, second, and third functional sub-structures 18, 20, and 22 are held in position above the cavity 6 by the first and second supporting elements 12, 14 and by the coupling elements 23, 24, 26, and 27.

It may further be noted that the frame 4 is separated from the first functional sub-structure 18 by a first through trench 30, which extends along the axis Z throughout the thickness of the deformable structure 2, and extends, in the plane XY, between the frame 4 and the first functional sub-structure 18 except for the restraint regions provided by the first and second supporting elements 12, 14.

The second functional sub-structure 20 is separated from the first functional sub-structure 18 by a second through trench 32, which extends between the first and second functional sub-structures 18, 20 except for the restraint regions provided by the coupling elements 23, 24.

The third functional sub-structure 22 is separated from the second functional sub-structure 20 by a third through trench 34, which extends between the second and third functional sub-structures 20, 22 except for the restraint regions provided by the coupling elements 26, 27.

In detail, the first, second, and third functional sub-structures 18, 20, and 22 each include a plurality of actuation arms, designated, respectively, by the reference numbers 18a, 18b; 20a, 20b; and 22a. The actuation arms are mutually parallel and have a direction of main extension along the axis Y. Further, the actuation arm 18a is symmetrical, with respect to the axis of symmetry B, to the actuation arm 18b; the actuation arm 20a is symmetrical, with respect to the axis of symmetry B, to the actuation arm 20b; finally, the actuation arm 22a extends along the axis of symmetry B and comprises the geometrical center O of the deformable structure 2. Observed with respect to the axis of symmetry B, the actuation arm 22a is also symmetrical.

Each of the first, second, and third functional sub-structures 18, 20, and 22 further comprises a plurality of connection arms, designated, respectively, by the reference numbers 18a', 18b'; 20a', 20b', which extend in a direction transverse to the connection arms 18a, 18b, and 20a', 20b', respectively. The connection arms 18a', 18b', 20a', 20b' are mutually parallel and have a direction of main extension along the axis X. The connection arms 18a' and 18b' are mechanically coupled to the actuation arms 18a, 18b, at opposite ends of the actuation arms 18a, 18b. In other words, the connection arm 18a' mechanically connects one end of the actuation arm 18a to a respective end of the actuation arm 18b, while the connection arm 18b' mechanically connects the other end of the actuation arm 18a to another respective end of the actuation arm 18b.

The connection arms 20a' and 20b' are mechanically coupled to the actuation arms 20a, 20b in a way similar to what has been described previously, i.e., at opposite ends of the actuation arms 20a, 20b.

The connection arms 18a' and 20a' are symmetrical to the connection arms 18b', 20b', respectively, when they are considered with respect to the axis of symmetry A.

It is evident that, in one embodiment, the connection arms extend as a prolongation of the ends of the actuation arms to which they are coupled without any discontinuity (i.e., without a break in continuity); for example, they are formed in a common layer of material and by manufacturing steps that are at least in part in common.

According to a further aspect, the actuation arm 18a has a through trench 36, which extends along the axis Z throughout the thickness of the actuation arm 18a, and has a direction of main extension parallel to the axis Y; the through trench 36 divides the arm 18a into two sub-portions 38a, 38b, in part uncoupling them. The sub-portions 38a, 38b are, in fact, designed to bend, in use, in the direction of the axis Z, but with orientations opposite to one another (e.g., the sub-portion 38a may bend in the negative direction of the axis Z, and at the same time the sub-portion 38b may bend in the positive direction of the axis Z).

The actuation arm 18b is similar to the actuation arm 18a, and has a respective through trench 37 that extends along the axis Z throughout the thickness of the actuation arm 18b, and has a direction of main extension parallel to the direction of the axis Y; the through trench 37 divides the actuation arm 18b into two sub-portions 39a, 39b uncoupling them in part so that they will be able to bend independently of one another with opposite orientations in the direction Z (e.g., the sub-portion 39a may bend in the negative direction of the axis Z, and at the same time the sub-portion 39b may bend in the positive direction of the axis Z).

As described above, the actuation arm 20a has a through trench 42 that extends along the axis Z throughout the thickness of the actuation arm 20a, and has a direction of main extension parallel to the direction of the axis Y; the through trench 42 divides the actuation arm 20a into two sub-portions 40a, 40b designed to bend independently of one another with opposite orientations in the direction Z (e.g., the sub-portion 40a may bend in the negative direction of the axis Z, and at the same time the sub-portion 40b may bend in the positive direction of the axis Z).

The arm 20b is similar to the actuation arm 20a, and has a respective through trench 43 that extends along the axis Z throughout the thickness of the actuation arm 20b and has a direction of main extension parallel to the direction of the axis Y; the through trench 43 divides the arm 20b into two sub-portions 41a, 41b designed to bend independently of one another with opposite orientations in the direction Z (e.g., the sub-portion 41a may bend in the negative direction of the axis Z, and at the same time the sub-portion 41b may bend in the positive direction of the axis Z).

The actuation arm 22 has two through trenches 45, 46, which extend along the axis Z throughout the thickness of the actuation arm 22 and have a direction of main extension parallel to the direction of the axis Y; the through trenches 45, 46 are symmetrical to one another with respect to the axis of symmetry B, and divide the actuation arm 22 into three sub-portions 47a, 47b, 47c, uncoupling them in part and rendering them able to bend independently of one another with opposite orientations in the direction Z (e.g., the sub-portions 47a and 47b may bend in the negative direction of the axis Z, and at the same time the sub-portion 47c may bend in the positive direction of the axis Z).

Figure 2:
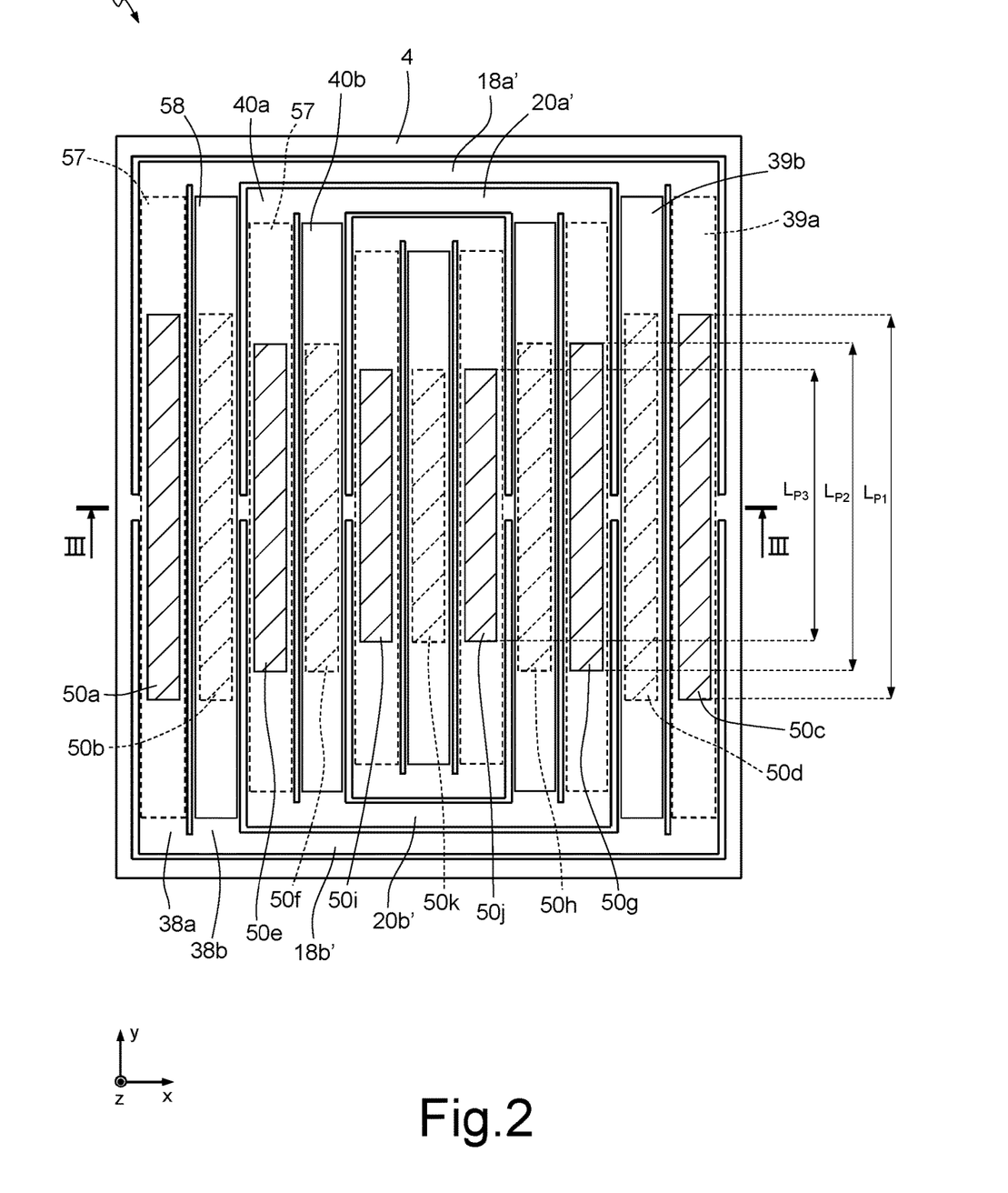
FIG. 2 illustrates, in top plan view, the MEMS actuator of FIG. 1 according to a further aspect of this disclosure.

As illustrated in FIG. 2, each of the sub-portions 38a, 38b, 39a, 39b, 40a, 40b, 41a, 41b, 47a-47c carries a respective actuation band 50a-50k, of piezoelectric material (in what follows, also referred to as "piezoelectric band").

FIG. 3 illustrates the actuator 1 of FIG. 2 in lateral cross-sectional view, in the plane XZ, taken along the line of section III-III of FIG. 2.

Figure 4A:
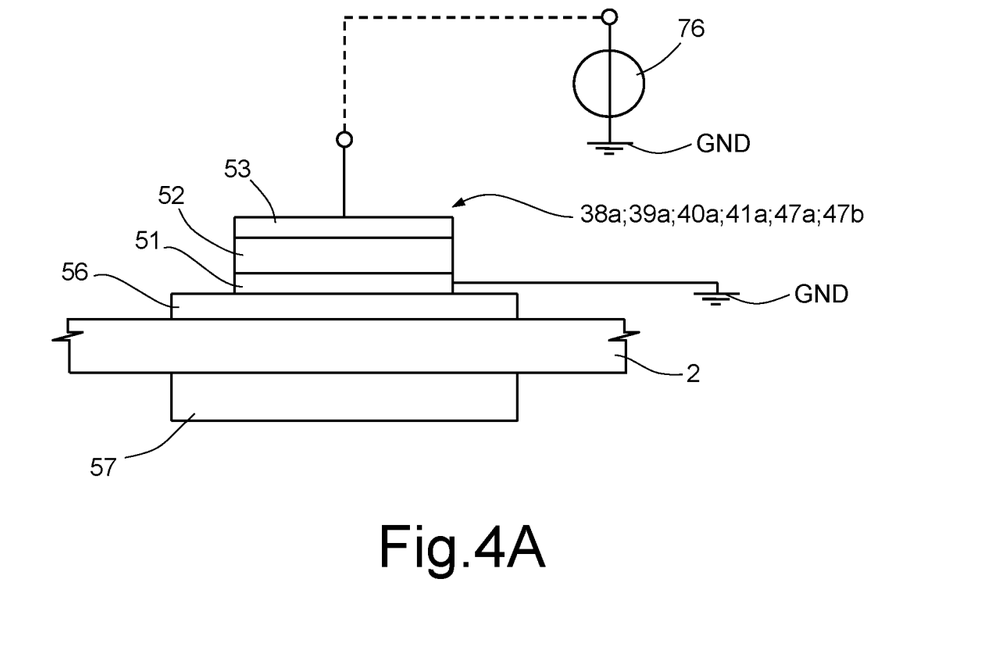
FIGS. 4A and 4B illustrate, with a higher degree of detail, portions of the MEMS actuator of FIG. 3.
Figure 4B:
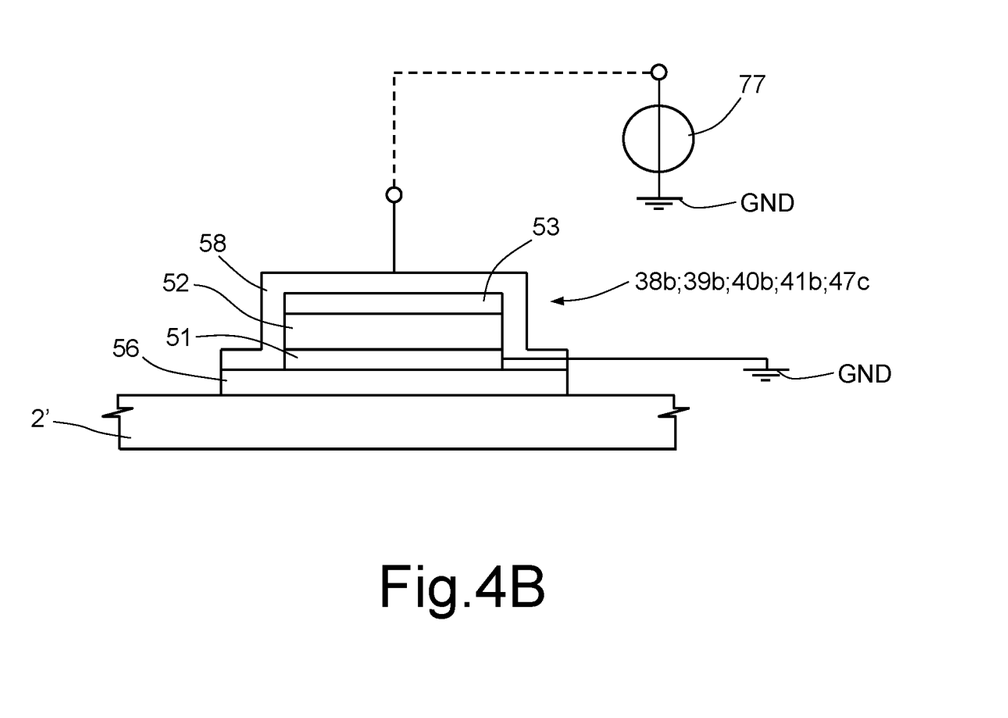

As illustrated in FIGS. 4A and 4B, each piezoelectric band 50a-50k comprises, in one embodiment, a stack formed by a first electrode 51 (made, for example, of Pt), a layer of piezoelectric material 52 (made, for example, of PZT), and a second electrode 53 (made, for example, of TiW). An insulating layer 56 (e.g., $SiO_2$) extends underneath the respective stack 51-53. Each piezoelectric band 50a-50k may thus be represented electrically as a capacitor, the first electrode 51 of which is connected to ground and the second electrode 53 of which is biased in the way described hereinafter.

FIG. 4A represents, in particular, the piezoelectric bands 50a, 50c, 50e, 50g, 50i, 50j. In this case, the stack 51-53 extends over the insulating layer 56, which, in turn, extends over the base supporting layer 2'; on an opposite face of the base supporting layer 2', extending in a region corresponding to the stack 51-53 is a thickness-increase layer 57, made, for example, of polysilicon. The thickness, measured along the axis Z, of the thickness-increase layer 57, in the case where it is made of polysilicon, is, for example, 4 μm. Other materials, different from polysilicon, may be used. In this case, the thickness is chosen according to the desired stiffness, the latter being a function of the ratio between Young's modulus and the thickness of the material used. In general, the desired stiffness for the thickness-increase layer 57 is between 100 kPa·m and 1600 kPa·m.

FIG. 4B represents, instead, the piezoelectric bands 50b, 50d, 50f, 50h, 50k. In this case, the respective stack 51-53 extends over the base supporting layer 2' and the insulating layer 56 and is covered by a thickness-increase layer 58, made, for example, of silicon nitride. The thickness, measured along the axis Z, of the thickness-increase layer 58, in the case where it is made of silicon nitride, is, for example, 3 μm. Other materials, different from silicon nitride, may be used. In this case, the thickness is chosen according to the desired stiffness for the thickness-increase layer 58. In general, the desired stiffness for the thickness-increase layer 58 is between 100 kPa·m and 1600 kPa·m.

From what has been described above, it follows that for each actuation arm 18a, 18b, 20a, 20b, and 22a, a respective sub-portion 38b, 39b, 40b, 41b, and 47c carries a respective piezoelectric band 50b, 50d, 50f, 50h, 50k of the type illustrated in FIG. 4A that is provided with the silicon-nitride structural layer 58 but without the polysilicon structural layer 57. Further, for each actuation arm 18a, 18b, 20a, 20b and 22a, a respective sub-portion 38a, 39a, 40a, 41a, and 47a-47b carries a respective piezoelectric band 50a, 50c, 50e, 50g, 50i-50j of the type illustrated in FIG. 4B that is without the silicon-nitride structural layer 58 but is provided with the polysilicon structural layer 57.

The piezoelectric bands 50a, 50b, 50c, and 50d have a main extension $L_{P1}$, along the axis Y, equal to approximately one half of the extension, along the axis Y, of the corresponding sub-portion 38a, 38b, 39a, 39b to which they are coupled (i.e., equal to $L_y/2$). Each piezoelectric band 50a, 50b, 50c and 50d is symmetrical with respect to the axis of symmetry A. For instance, the value of $L_{P1}$ is 1300 µm.

The piezoelectric bands 50e, 50f, 50h, and 50g have a main extension $L_{P2}$, along the axis Y, equal to approximately one half of the extension, along the axis Y, of the corresponding sub-portion 40a, 40b, 41a, 41b to which they are coupled. Each piezoelectric band 50e, 50f, 50h, and 50g is symmetrical with respect to the axis of symmetry A. For instance, the value of $L_{P2}$ is 1000 µm.

The piezoelectric bands 50i, 50k, and 50j have a main extension $L_{P3}$, along the axis Y, equal to approximately one half of the extension, along the axis Y, of the corresponding sub-portion 47a, 4cb, 47b to which they are coupled. Each piezoelectric band 50i, 50k, and 50j is symmetrical with respect to the axis of symmetry A. For instance, the value of $L_{P3}$ is 800 µm.

The piezoelectric bands 50a, 50c, 50e, 50g, 50i, 50j are electrically connected to a first voltage generator 76, and the piezoelectric bands 50b, 50d, 50f, 50h, 50k are electrically connected to a second voltage generator 77 via metal connections illustrated only schematically in FIGS. 4A and 4B in so far as they are in themselves of a known type. The voltage generators 76 and 77 may, in one embodiment, coincide with one another. The voltage generators 76 and 77 are configured to bias the piezoelectric bands at a working voltage, for example comprised between 0 V and 80 V. The working voltage is, in particular, of a unipolar or unidirectional type (i.e., the working voltage is always comprised between zero and the maximum positive or negative voltage; in other words, the supply signal assumes, in time, only negative voltage values or, alternatively, only positive voltage values).

Figure 5A:
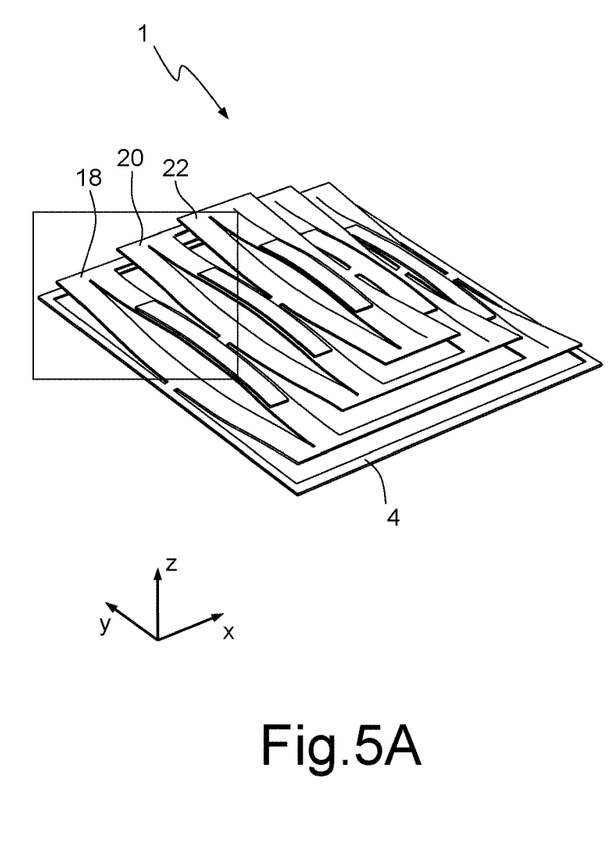
FIG. 5A illustrates, in perspective view, the MEMS actuator according to this disclosure.
Figure 5B:
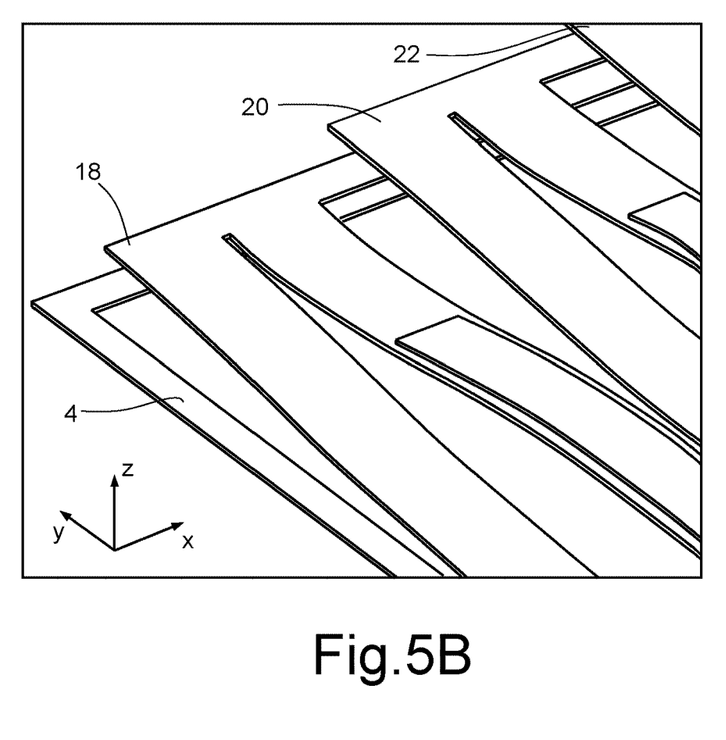
FIG. 5B illustrates an enlarged detail of the MEMS actuator of FIG. 5A.

FIG. 5A shows schematically, in perspective view, the actuator 1 during an operating condition; FIG. 5B is an enlarged view of the portion represented circled in FIG. 5A.

As may be noted from FIGS. 5A and 5B, when the piezoelectric bands 50a-50k are biased at the working voltage, they induce a stress in the sub-portions 38a-47c of the arms 18a-22a to which they are coupled, which consequently generates bending of the sub-portions 38a-47c themselves.

The stress induced by the electrical field in the PZT generates a concave or convex deflection in the sub-portions 38a-47c that is a function of the presence/absence of the thickness-increase layers 57 and 58. In particular, the piezoelectric bands 50b, 50d, 50f, 50h, 50k generate, in the silicon-nitride layer 58, a tensile stress that, transmitted by the thickness-increase layer 58 to the insulating layer 56 and to the base supporting layer 2', causes a downward bending, also conventionally referred to as "positive bending", of the respective sub-portions 38b, 39b, 40b, 41b, and 47c. The piezoelectric bands 50a, 50c, 50e, 50g, 50i-50j generate, in the thickness-increase layer 57, a compressive stress that causes an upward bending, also conventionally referred to as "negative bending", of the respective sub-portions 38a, 39a, 40a, 41a, and 47a-47b.

As a result of the fact that the deformable structure 2 is coupled to the frame 4 exclusively by the first and second supporting elements 12, 14, the positive bending of the sub-portions 38a and 39a causes a displacement, or translation, of the connection arms 18a' and 18b' in the positive direction of the axis Z (i.e., away from the cavity 6). Since the sub-portions 38b, 39b are coupled to the connection arms 18a' and 18b', they will undergo a similar displacement in the positive direction of the axis Z. Further, as a result of the biasing of the piezoelectric bands 50b, 50d, the sub-portions 38b, 39b undergo a negative bending that causes a further displacement, or translation, in the positive direction of the axis Z (i.e., away from the cavity 6), of their portions comprised between the connection arms 18a' and 18b'. The maximum displacement is obtained at the centroid of the sub-portions 38b, 39b, i.e., in a position corresponding to the axis of symmetry A.

Since the coupling elements 23, 24 constrain the sub-portions 38b, 39b to the actuation arms 20a, 20b, the latter are subjected to a displacement, in the positive direction of the axis Z, equal to the sum of the displacements of the sub-portion 38a (respectively 39a) and of the sub-portion 38b (respectively 39b).

In turn, the sub-portions 40a-40b and 41a-41b, are subjected to a bending similar to the one described for the sub-portions 38a-38b and 39a-39b, respectively.

Since the coupling elements 26, 27 constrain the sub-portions 40b, 41b to the actuation arm 22, the latter is subjected to a displacement, in the positive direction of the axis Z, equal to the sum of the displacements of the sub-portion 38a, of the sub-portion 38b, of the sub-portion 40a, and of the sub-portion 40b (corresponding to the sum of the displacements of the sub-portion 39a, of the sub-portion 39b, of the sub-portion 41a, and of the sub-portion 41b).

In turn, the sub-portions 47a and 47b are subjected to a bending similar to the one described for the sub-portions 38a, 39a, 40a, and 41a, while the sub-portion 47c is subjected to a bending similar to the one described for the sub-portions 38b, 40b, 39b, and 41b.

There is thus obtained an effective displacement of the sub-portion 47c in the positive direction of the axis Z equal to the sum of the displacements of the sub-portions 38a, 38b, 40a, 40b, and 47a (equivalent to the sum of the displacements of the sub-portions 39a, 39b, 41a, 41b, and 47b) with respect to a resting condition of lie in the plane XY.

In use, the voltage generators 76, 77 are phase-controlled. In particular, as a function of the desired displacement, i.e., as a function of the maximum height that is to be reached along the axis Z, an actuation voltage is applied, in particular of a unipolar type, to the piezoelectric bands 50a-50k comprised between 0 V (deformable structure 2 in the resting condition) and 40 V (deformable structure 2 in a condition of maximum extension along the axis Z). As indicated above, in these conditions, the actuation arms undergo deformation and bend, and the bending is all the more accentuated, the higher the voltage applied to the piezoelectric bands 50a-50k.

As illustrated in FIGS. 5A and 5B, the angle of deflection (measured with respect to the plane XY) of each sub-portion 38a, 39a, 40a, 41a, 47c increases as the latter move away from the supporting (also considered coupling and/or anchorage) elements 12, 14, 23-27, up to a maximum of 10° at the connection arms 18a', 18b', 20a', 20b'.

Figure 8:
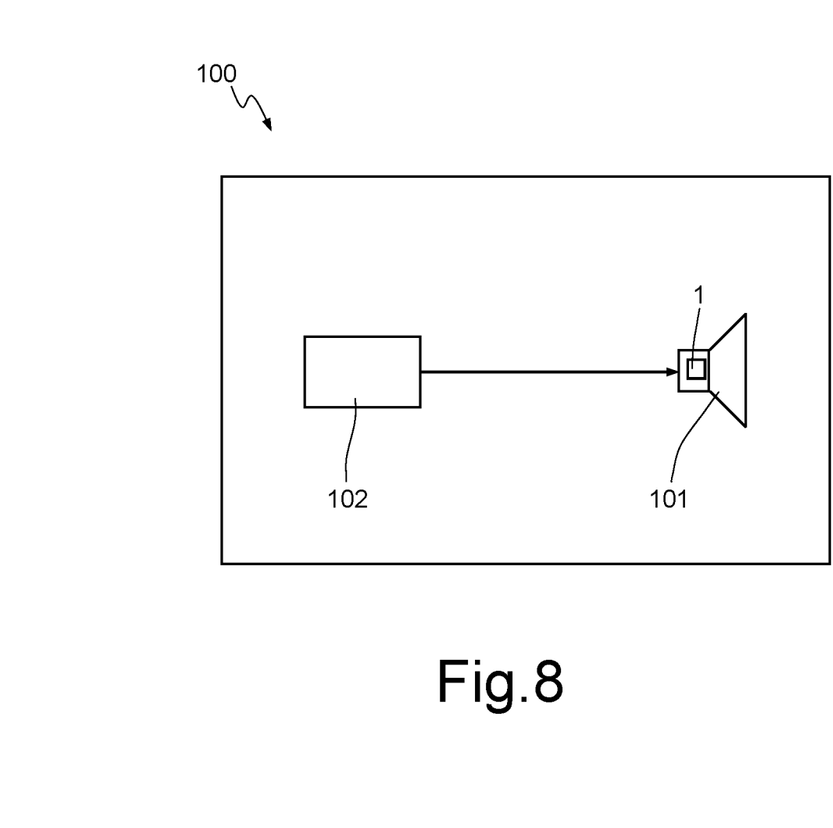
FIG. 8 illustrates an apparatus that comprises a MEMS actuator according to embodiments of this disclosure.

The actuator 1 finds application, for example, in a speaker 101 for use in a portable electronic apparatus 100, as illustrated in FIG. 8. The speaker 101 integrates the actuator 1, which, when actuated, has the function of displacing a diaphragm in order to generate an acoustic wave. A driving circuit 102 is configured to supply the operating voltage necessary for biasing the piezoelectrics, for actuation of the actuator 1 according to what has been described previously.

Other applications of the actuator device regard height micro-positioners, mechanical micro-elevators or nano-elevators (of a telescopic type, or miniature elevators), micro-contactors between two contacts with a certain gap along the axis Z, and the like.

The actuator 1 described herein presents numerous advantages. In particular, the technology described herein makes it possible to obtain, in use, a marked displacement of an actuation portion (here, the sub-portion 47c) with respect to a resting condition thereof. The total displacement is given by a sum of local displacements. Given the same maximum height reached by the actuation portion, the technology described herein enables reduction of the consumption of area as compared to a membrane actuator of a known type.

Finally, it is clear that modifications and variations may be made to the microelectronic device described and illustrated herein, without thereby departing from the scope of the technology described herein, as defined in the annexed claims.

Figure 6:
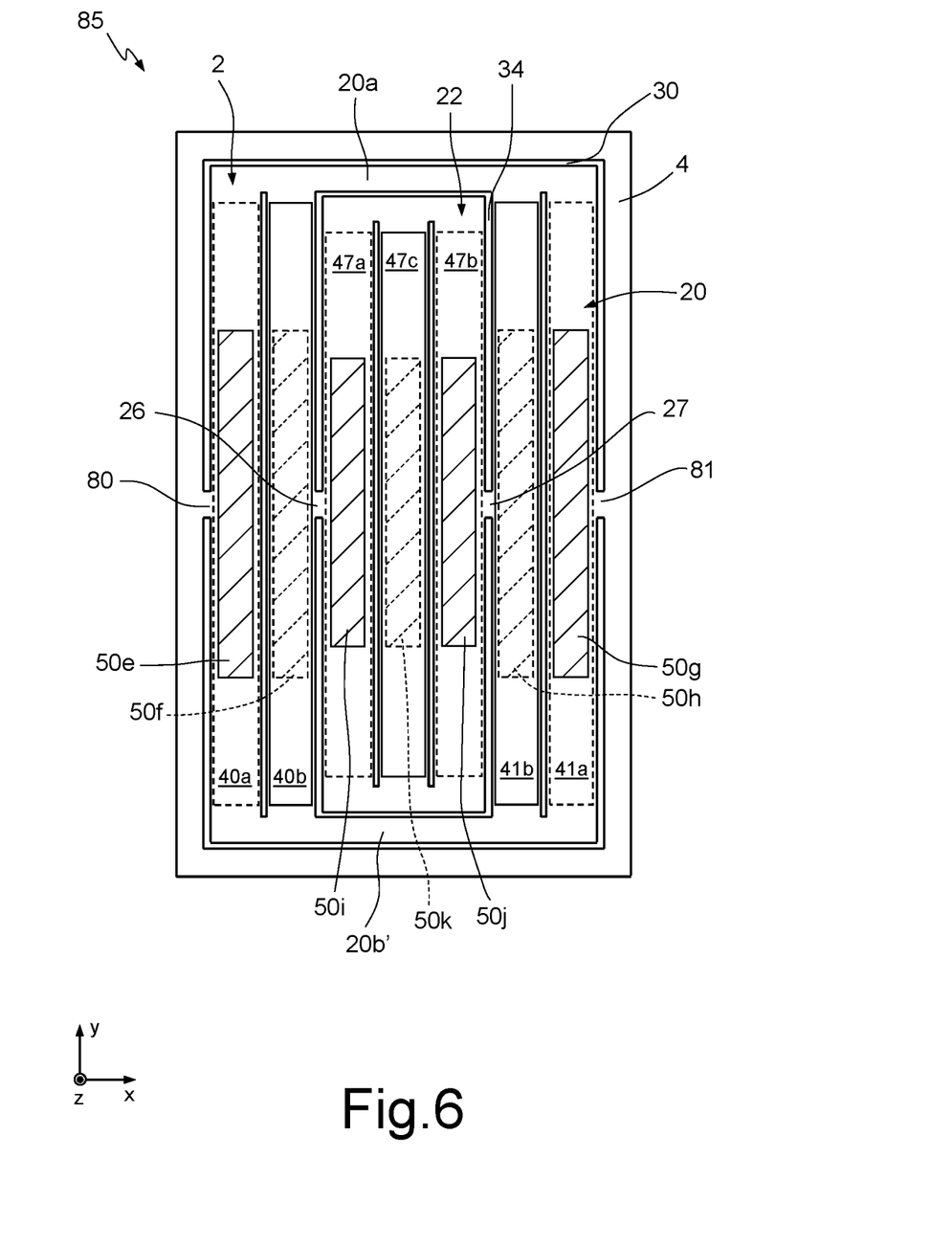
FIG. 6 illustrates a MEMS actuator according to a further embodiment of this disclosure.

For instance, as illustrated in FIG. 6, in an actuator 85 according to a further embodiment, the first functional sub-structure 18 is not present. In this case, the second functional sub-structure 20 is mechanically coupled to the frame 4 by supporting elements 80, 81 similar to the supporting elements 12, 14. The through trench 30 extends, in this case, between the frame 4 and the second functional sub-structure 20 except for the regions in which the supporting elements 80, 81 are present. The second functional sub-structure 20 is thus coupled to the frame 4 exclusively in a position corresponding to the supporting elements 80, 81, and is otherwise free to move with respect to the frame 4. The remaining technical characteristics, as likewise the operating principle, are in accordance with the ones already described with reference to the foregoing figures and the respective embodiments, and are thus not described any further herein for reasons of brevity.

Figure 7:
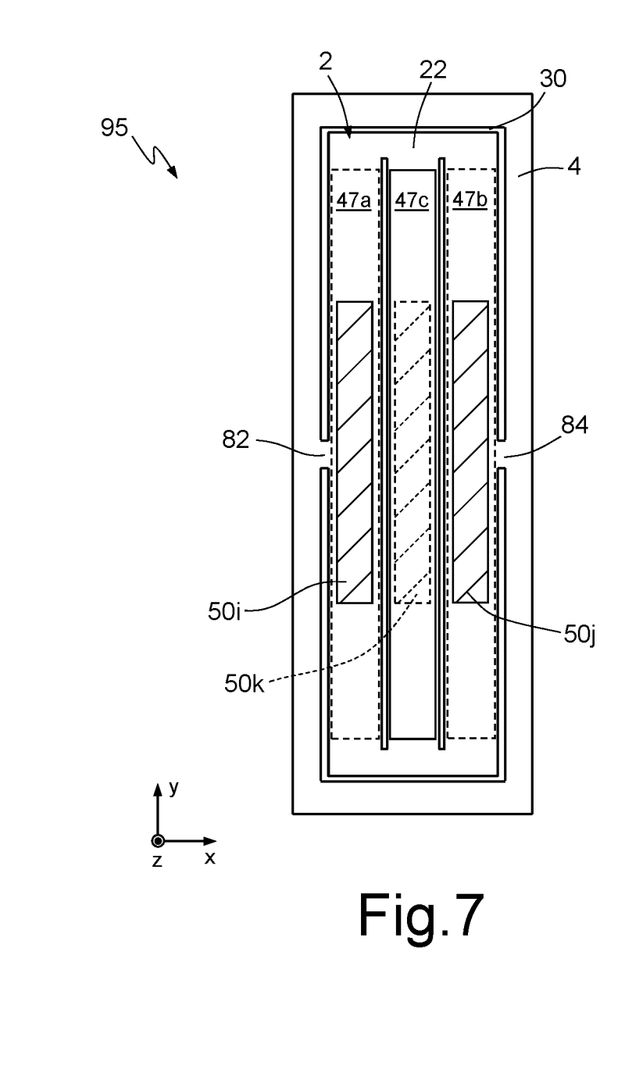
FIG. 7 illustrates a MEMS actuator according to a further embodiment of this disclosure.

In an actuator 95 according to a further embodiment (illustrated in FIG. 7), neither the first functional sub-structure 18 nor the second functional sub-structure 20 are present. In this case, the third functional sub-structure 22 is mechanically coupled to the frame 4 by supporting elements 82, 84 similar to the supporting elements 12, 14. The through trench 30 extends, in this case, between the frame 4 and the third functional sub-structure 22 except for the regions in which the supporting elements 82, 84 are present. The third functional sub-structure 22 is thus coupled to the frame 4 exclusively at the supporting elements 82, 84, and is otherwise free to move with respect to the frame 4. The remaining technical characteristics, as likewise the operating principle, are in accordance with the ones already described with reference to the foregoing figures and the respective embodiments, and thus are not described any further herein for reasons of brevity.

In a further embodiment (not illustrated in the figures), further functional sub-structures may be present similar to the functional sub-structure 18 or 20 (i.e., having a similar shape and comprising the same mechanical elements and the actuation piezoelectrics), said further functional sub-structures extending between the frame 4 and the first functional sub-structure 18 and/or between the first functional sub-structure 18 and the second functional sub-structure 20 and/or between the second functional sub-structure 20 and the third functional sub-structure 22.

Further, the examples indicated previously with reference to the dimensions, materials, and voltages for controlling the piezoelectrics are to be deemed as purely indicative of a possible non-limiting embodiment of the technology described herein. Variations in shape, materials, dimensions, and control voltages are possible and within the reach of the person skilled in the art on the basis of the teachings of the present disclosure.

The invention claimed is:
1. A micro-electro-mechanical (MEMS) actuator device, comprising:
a fixed structure; and
a mobile structure configured to move along a driving direction and including a first deformable band, a second deformable band and a third deformable band which lie, in a first operating condition, in a resting plane and have a respective main extension along a first direction orthogonal to the driving direction, the first deformable band being arranged between the second and third deformable bands and being mechanically uncoupled, along said first direction, from the second and third deformable bands by respective first and second through trenches;
wherein the first, second, and third deformable bands each have respective ends and being joined together;
wherein the second deformable band is further coupled to the fixed structure by a first supporting element, and the third deformable band is coupled to the fixed structure by a second supporting element, the first and second supporting elements being aligned to one another, at least in the first operating condition, along a same first axis of symmetry orthogonal to said first direction;
wherein the first, second, and third deformable bands house first, second, and third piezoelectrics, respectively;
wherein the second and third deformable bands and the respective second and third piezoelectrics are arranged with respect to one another and configured so that, in a second operating condition where the second and third piezoelectrics are biased by a working voltage, the second and third deformable bands are subjected to a negative bending that causes a translation of said ends of the first, second, and third deformable bands, and of the first deformable band, in said driving direction;
wherein the first deformable band and the respective first piezoelectric are arranged with respect to one another and configured so that, when the first piezoelectric is biased at the working voltage, the first deformable band is subjected to a positive bending that causes a further translation in said driving direction of at least one portion of the first deformable band, which extends between said ends of the first deformable band;
wherein the translation of said ends of the first, second, and third deformable bands and of the first deformable band and said further translation of at least one portion of the first deformable band are directed with a same orientation as that of said driving direction, adding to one another.

2. The MEMS actuator device according to claim 1, wherein the first, second, and third piezoelectrics extend at respective first sides of the first, second, and third deformable bands; and
wherein said mobile structure further comprises:
a first thickness-increase region at the first side of the first deformable band above the first piezoelectric;
a second thickness-increase region at a second side, opposite to the first side in the driving direction, of the second deformable band; and
a third thickness-increase region at a respective second side, opposite to the respective first side in the driving direction, of the third deformable band.

3. The MEMS actuator device according to claim 2, wherein the first thickness-increase region has a thickness, in the driving direction, of between 0.2 μm and 20 μm.

4. The MEMS actuator device according to claim 2, wherein the second and third thickness-increase regions have a same thickness, in the driving direction, comprised between 0.2 μm and 20 μm.

5. The MEMS actuator device according claim 2, wherein the first, second, and third thickness-increase regions have an extension, in the first direction, equal to or greater than the extension of the first, second, and third piezoelectrics.

6. The MEMS actuator device according to claim 2, wherein the first thickness-increase region is comprised of silicon nitride.

7. The MEMS actuator device according to claim 2, wherein the second and third thickness-increase regions are both comprised of polysilicon.

8. The MEMS actuator device according to claim 1, wherein said fixed structure extends alongside said mobile structure and at a distance from the mobile structure so that the fixed structure and the mobile structure are mechanically uncoupled from one another except for regions connected to said first and second supporting elements.

9. The MEMS actuator device according to claim 1, wherein said mobile structure is a suspended platform carried by said fixed structure, said first and second supporting elements forming a rigid suspension structure lying, both in the first operating condition and in the second operating condition, in the resting plane.

10. The MEMS actuator device according to claim 1, wherein the mobile structure is suspended over a cavity formed in a body of semiconductor material forming, at least in part, said fixed structure.

11. The MEMS actuator device according to claim 1, wherein the first, second, and third deformable bands have, in the resting plane, a rectangular shape with a major side along the first direction and a minor side along a second direction orthogonal to the first direction and to the driving direction;
wherein the first, second, and third piezoelectrics have, in the resting plane, a rectangular shape with a major side along the first direction of a length equal to half of the major side than the first, second, and third deformable bands; and
wherein geometrical centers of the first, second, and third deformable bands coincide with respective geometrical centers of the first, second, and third piezoelectrics.

12. The MEMS actuator device according to claim 11, wherein the geometrical centers of the first, second, and third deformable bands and the geometrical centers of the first, second, and of the third piezoelectrics are aligned with respect to one another along said first axis of symmetry.

13. The MEMS actuator device according to claim 11, wherein said mobile structure is further symmetrical both with respect to the first axis of symmetry and with respect to a second axis of symmetry parallel to said first direction and passing through the geometrical center of the first deformable band.

14. The MEMS actuator device according claim 1, wherein the mobile structure further comprises:
a fourth deformable band and a fifth deformable band, which lie in the resting plane and have a respective main extension in the first direction, and are arranged between the second deformable band and the first supporting element, mechanically uncoupled from one another, in said first direction, by a third through trench; and
a sixth deformable band and a seventh deformable band, which lie in the resting plane and have a respective main extension in the first direction, and are arranged between the third deformable band and the second supporting element, mechanically uncoupled from one another, in said first direction, by a fourth through trench;
wherein the fourth, fifth, sixth, and seventh deformable bands are mechanically coupled together, at respective first ends, by a first connection arm and, at respective second ends, by a second connection arm;
wherein the fifth deformable band extends at a distance from, and directly faces, the second deformable band, and is mechanically coupled to the second deformable band by a coupling element, while the fourth deformable band is mechanically coupled to the fixed structure by the first supporting element;
wherein the seventh deformable band extends at a distance from, and directly faces, the third deformable band and is mechanically coupled to the third deformable band by a coupling element, while the sixth deformable band is mechanically coupled to the fixed structure by the second supporting element; and
wherein the fourth, fifth, sixth, and seventh deformable bands house a fourth piezoelectric, a fifth piezoelectric, a sixth piezoelectric, and a seventh piezoelectric, respectively.

15. The MEMS actuator device according to claim 14, wherein the fourth and sixth deformable bands and the respective fourth and sixth piezoelectrics are arranged with respect to one another and configured so that, in the second operating condition where the fourth and sixth piezoelectrics are biased at the working voltage, the fourth and sixth deformable bands are subjected to a negative bending that causes translation of the first and second connection arms and of the fifth and seventh deformable bands in said driving direction; and
wherein the fifth and seventh deformable bands and the respective fifth and seventh piezoelectrics are arranged with respect to one another and configured so that, in the second operating condition where the fifth and seventh piezoelectrics are biased at the working voltage, the fifth and seventh deformable bands are subjected to a positive bending that causes a further translation in said driving direction of portions of the fifth and seventh deformable bands that extend between the first and second connection arms.

16. The MEMS actuator device according to claim 14, wherein the first and second connection arms are mutually parallel and symmetrical with respect to said first axis of symmetry.

17. The MEMS actuator device according to claim 1, wherein the first, second, and third piezoelectrics are electrically coupled to a voltage generator.

18. The MEMS actuator device according to claim 17, wherein the voltage generator is configured to bias the first, second, and third piezoelectrics to a zero operating voltage in the first operating condition and to an operating voltage between 0 V and 50 V in the second operating condition.

19. A portable electronic device, comprising:
a an apparatus including an actuator device;
wherein the actuator device comprises:
   a fixed structure; and
   a mobile structure configured to move along a driving direction, the mobile structure including a first deformable band, a second deformable band, and a third deformable band which lie, in a first operating condition, in a resting plane and have a respective main extension along a first direction orthogonal to the driving direction, the first deformable band being arranged between the second and third deformable bands;
wherein the first, second, and third deformable bands each having respective ends and being joined together at those ends;
wherein the second deformable band is further coupled to the fixed structure by a first supporting element, and the third deformable band is coupled to the fixed structure by a second supporting element, the first and second supporting elements being aligned with one another; and
wherein the first, second, and third deformable bands house first, second, and third piezoelectrics, respectively;
wherein the second and third deformable bands and the second and third piezoelectrics are arranged with respect to one another and configured so that, in a second operating condition where the second and third piezoelectrics are biased, the second and third deformable bands are subjected to a negative bending that causes a translation of said ends and the first, second, and third deformable bands in said driving direction;
wherein the first deformable band and the first piezoelectric are arranged with respect to one another and configured so that, when the first piezoelectric is biased at the working voltage, the first deformable band is subjected to a positive bending that causes a further translation in said driving direction of at least one portion of the first deformable band; and
wherein the translation of said ends of the first, second, and third deformable bands and of the first deformable band and said further translation of at least one portion of the first deformable band are directed with a same orientation as that of said driving direction, adding to one another.

20. The portable electronic device of claim 19, wherein the first, second, and third piezoelectrics extend at respective first sides of the first, second, and third deformable bands.

21. The portable electronic device of claim 19, wherein said mobile structure further comprises:
   a first thickness-increase region at a first side of the first deformable band above the first piezoelectric;
   a second thickness-increase region at a second side, opposite to the first side in the driving direction, of the second deformable band; and
   a third thickness-increase region at a second side, opposite to the first side in the driving direction, of the third deformable band.

22. The portable electronic device of claim 21, wherein the first thickness-increase region has a thickness, in the driving direction, of between 0.2 μm and 20 μm.

23. The portable electronic device of claim 21, wherein the second and third thickness-increase regions have a same thickness, in the driving direction, comprised between 0.2 μm and 20 μm.

24. The portable electronic device of claim 21, wherein the first, second, and third thickness-increase regions have an extension, in the first direction, equal to or greater than the extension of the first, second, and third piezoelectrics.

25. The portable electronic device of claim 19, further comprising a driving circuit configured to supply an operating voltage to the first, second, and third piezoelectrics.

26. The portable electronic device of claim 19, wherein the apparatus is configured to define a speaker, a micro-positioner, a micro-elevator or nano-elevator, or a micro-contactor.

* * * * *